United States Patent
Lee

(10) Patent No.: US 6,958,641 B2
(45) Date of Patent: Oct. 25, 2005

(54) DELAY CIRCUIT WITH MORE-RESPONSIVELY ADAPTING DELAY TIME

(75) Inventor: You Mi Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 27 days.

(21) Appl. No.: 10/798,560

(22) Filed: Mar. 12, 2004

(65) Prior Publication Data

US 2005/0001667 A1 Jan. 6, 2005

(30) Foreign Application Priority Data

Jun. 19, 2003 (KR) .................................. 10-2003-0039637

(51) Int. Cl.[7] .............................................. H03H 11/26
(52) U.S. Cl. ...................................... 327/261; 327/262
(58) Field of Search ................................. 327/261, 262, 327/263, 264, 268, 276, 284, 285

(56) References Cited

U.S. PATENT DOCUMENTS 6,147,536 A * 11/2000 Jeong ........................ 327/283

6,323,712 B1 * 11/2001 Shih ........................... 327/276

\* cited by examiner

*Primary Examiner*—Linh My Nguyen
(74) *Attorney, Agent, or Firm*—Harness, Dickey & Pierce P.L.C.

(57) ABSTRACT

A delay circuit, e.g., for a semiconductor device, having a plurality of cascade-connected stages that successively delay an input signal, may include: plural cascaded-connected delay devices representing instances of a first type of delay unit corresponding to the stages, respectively; plural resistance units coupled between a node having a source voltage of varying magnitude Vvar and odd-numbered ones of the delay devices, respectively; and plural capacitance units coupled between a node having another voltage Vuni of substantially uniform magnitude relative to Vvar and nodes representing the outputs of the odd-numbered delay devices; where corresponding ones of the plurality of capacitor units and the plurality of resistance units represent instances, respectively, of a second type of delay unit.

19 Claims, 7 Drawing Sheets

FIG. 1(BACKGROUND)
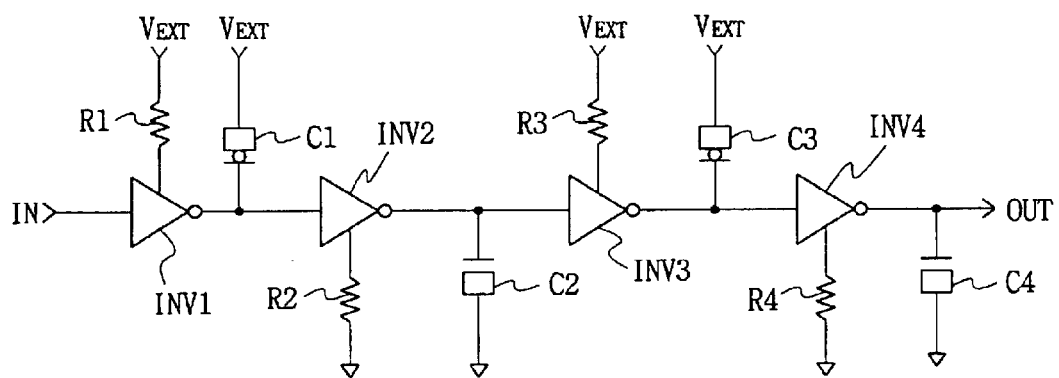
FIG. 3
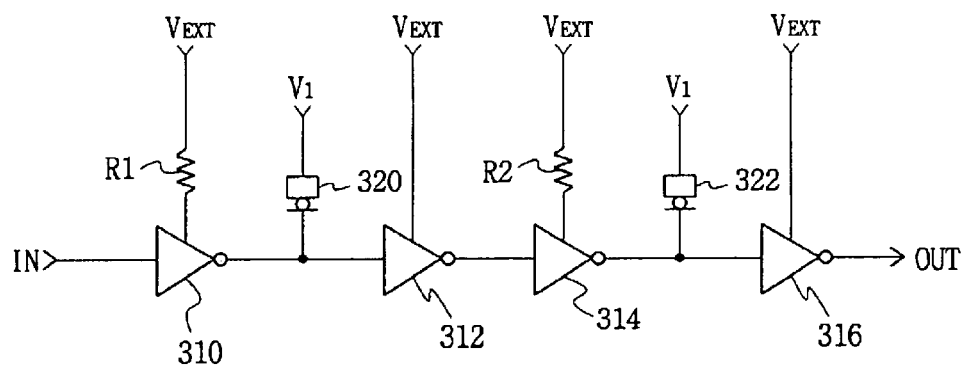

FIG. 5
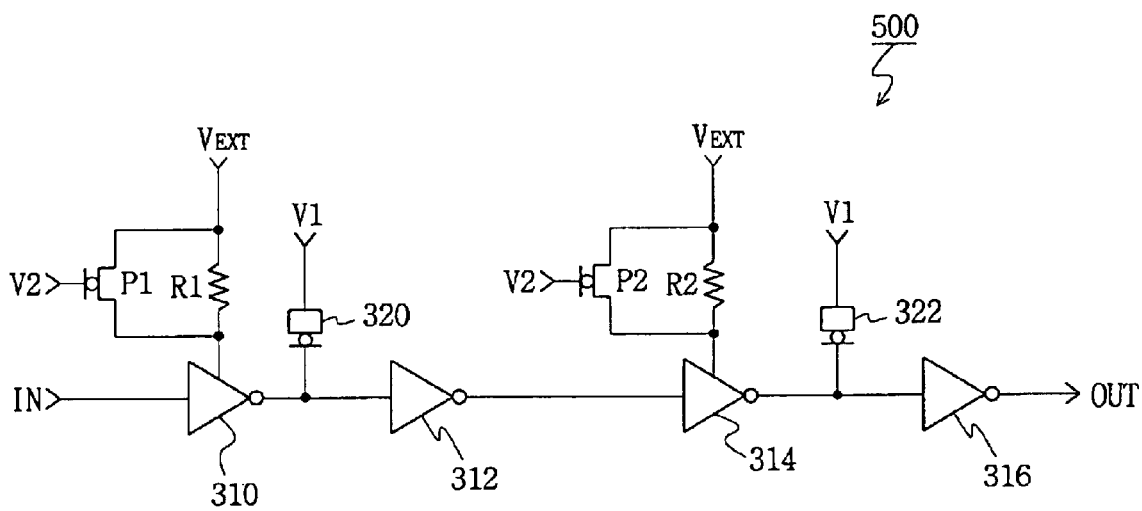
FIG. 6A
FIG. 6B
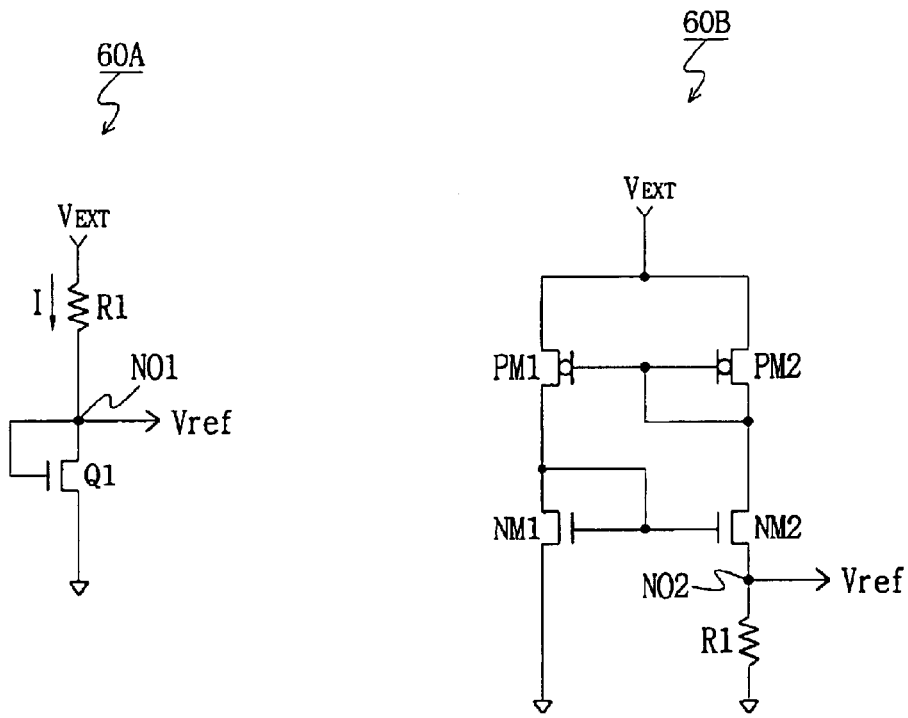

DELAY CIRCUIT WITH MORE-RESPONSIVELY ADAPTING DELAY TIME

This U.S. nonprovisional patent application claims priority under 35 U.S.C. § 119 of Korean Patent Application 2003-39637 filed on Jun. 19, 2003, the entire contents of which is hereby incorporated by reference.

BACKGROUND OF THE PRESENT INVENTION

Semiconductor devices, e.g., , memory devices, etc., are generally provided with a delay circuit for adaptively delaying signals generated locally or for delaying externally-applied signals. Such a delay circuit has been used as a timing control component in semiconductor devices.

The delay circuit typically provided in this field has a chain configuration constructed of CMOS inverters, and resistances and capacitors. The delay chain uses an external or internal source voltage as an operating voltage. If the operating voltage increases, an amount of delay induced by such a delay chain is reduced based on a change of internal impedance, etc.

FIG. 1 depicts a delay circuit used with a semiconductor device, according to the Background Art. In FIG. 1, CMOS inverters INV1–INV4 are cascade-connected and represent four stages that constitute the delay chain. Each stage includes a CMOS inverter INVi, a capacitance unit Ci, and a resistance unit Ri. Resistance units R1, R3 are connected between each of odd-numbered CMOS inverters INV1, INV3 and a source voltage node, e.g., an externally-applied source voltage $V_{EXT}$, respectively. Resistance units R2, R4 are each connected between each of even-numbered CMOS inverters INV2, INV4 and a node having ground voltage, respectively. Capacitance units C1, C3 are connected between $V_{EXT}$ and the outputs of odd-numbered CMOS inverters INV1, INV3, respectively. Capacitance units C2, C4 are connected between outputs of even-numbered CMOS inverters INV2, INV4 and a node having ground voltage, respectively.

Each of CMOS inverters INV1–INV4 functions as a unit delay. Resistance unit R1 and capacitance unit C1 together constitute another type of delay unit, namely an RC-type delay unit. Similarly, resistance unit R2 & capacitance unit C2, resistance unit R3 & capacitance unit C3 and resistance unit R4 & capacitance unit C4 constitute RC-type delay units, respectively.

An input signal IN that is provided at an input terminal is delayed by a delay operation of inverters INV1–INV4, resistance units R1–R4 and capacitance units C1–C4, and is then output at an output terminal as output signal OUT.

Operation of the Background Art delay chain of FIG. 1 will now be described. If a level of $V_{EXT}$ increases (due to any of various causes), current flowing through resistance units R1, R3 increases, and so the operating current of inverters INV1, INV3 increases. As such operating current increases, the delay times to complete the inverting operation (representing the delay times induced by inverters INV1, INV3) decrease, respectively.

Some types of apparatus can benefit from a delay chain's reduction in delay time associated with an increase in $V_{EXT}$. For example, in a high-speed semiconductor memory device, operation of a sense amplifier (for sensing data of a memory cell) can cause a level of the array source voltage (which is the operating voltage applied to cells in a memory device) to drop momentarily. To prevent such a momentary drop in the array source voltage, the Background Art employs a scheme for adaptively overdriving an array source voltage generator (that generates the array source voltage) in which a control pulse is: generated in response to a sense amplifier enable signal; and is then passed through the delay circuit of FIG. 1. Accordingly, the width of the control pulse is reduced when the array source voltage increases, which reduces a degree to which the array source voltage generator is overdriven.

SUMMARY OF THE PRESENT INVENTION

At least one embodiment of the present invention provides a semiconductor device having a delay circuit capable of more-significantly (relative to the Background Art) changing (e.g., reducing) a delay time when a source voltage, an externally-applied source voltage $V_{EXT}$, is varied.

Additional features and advantages of the invention will be more fully apparent from the following detailed description of example embodiments and the accompanying drawings.

BRIEF DESCRIPTION OF THE DRAWINGS

The foregoing and other features and advantages of the present invention will be apparent from the more particular description of example embodiments of the present invention, as illustrated in the accompanying drawings in which like reference characters refer to the same parts throughout the different views, in which:

FIG. 1 is a circuit diagram of a delay circuit adapted to a semiconductor device according to the Background Art;

FIG. 3 is a circuit diagram illustrating an example implementation of the delay circuit referred to in FIG. 2, according to another embodiment of the present invention;

FIG. 5 is a circuit diagram illustrating an example implementation of the delay circuit referred to FIG. 4, according to another embodiment of the present invention;

FIGS. 6A–6B are circuit diagrams depicting example implementations of a control voltage generator, according to other embodiments of the present invention.

DETAILED DESCRIPTION OF EXAMPLE EMBODIMENTS OF THE PRESENT INVENTION

The present invention and example embodiments, thereof, are more fully described below with reference to the accompanying drawings. This present invention may, however, be embodied in many different forms and should not be construed as being limited to the example embodiments set forth herein. Rather, these example embodiments are provided so that this disclosure is thorough and complete, and conveys the concept of the present invention to those skilled in the art.

In developing the present invention, the following problems with the Background Art were recognized and the path to a solution thereof determined. Study of the Background Art delay chain (see FIG. 1) type of delay circuit reveals that amounts of charge accumulated by capacitors units C1, C3, respectively, increase proportionally to an increase in an operating voltage (again, e.g., an externally provided source voltage, $V_{EXT}$), which tends to lengthen the delay induced by the corresponding RC-type delay units. The effect of such changes in delay time of the RC-type delay units is to offset the reduction in delay time exhibited by inverters INV1, INV3, and more generally limit the responsiveness of the Background Art delay circuit to changes in $V_{EXT}$. Hence, only the changes in currents flowing through resistance units R1, R3 significantly reduce an amount of delay induced (as a whole) by the Background Art delay chain. Consequently, the reduction in the width of the control pulse by the Background Art delay chain is often insufficient, resulting in errors related to data-access operations of the associated Background Art semiconductor memory device. Hence, a need is perceived for a more responsive delay circuit that exhibits greater reductions in delay relative to increases in the operating voltage, e.g., $V_{EXT}$, the use of which can provide, e.g., an improved semiconductor memory device. At least on embodiment of the present invention provides such a more-responsive delay circuit.

Figure 2:
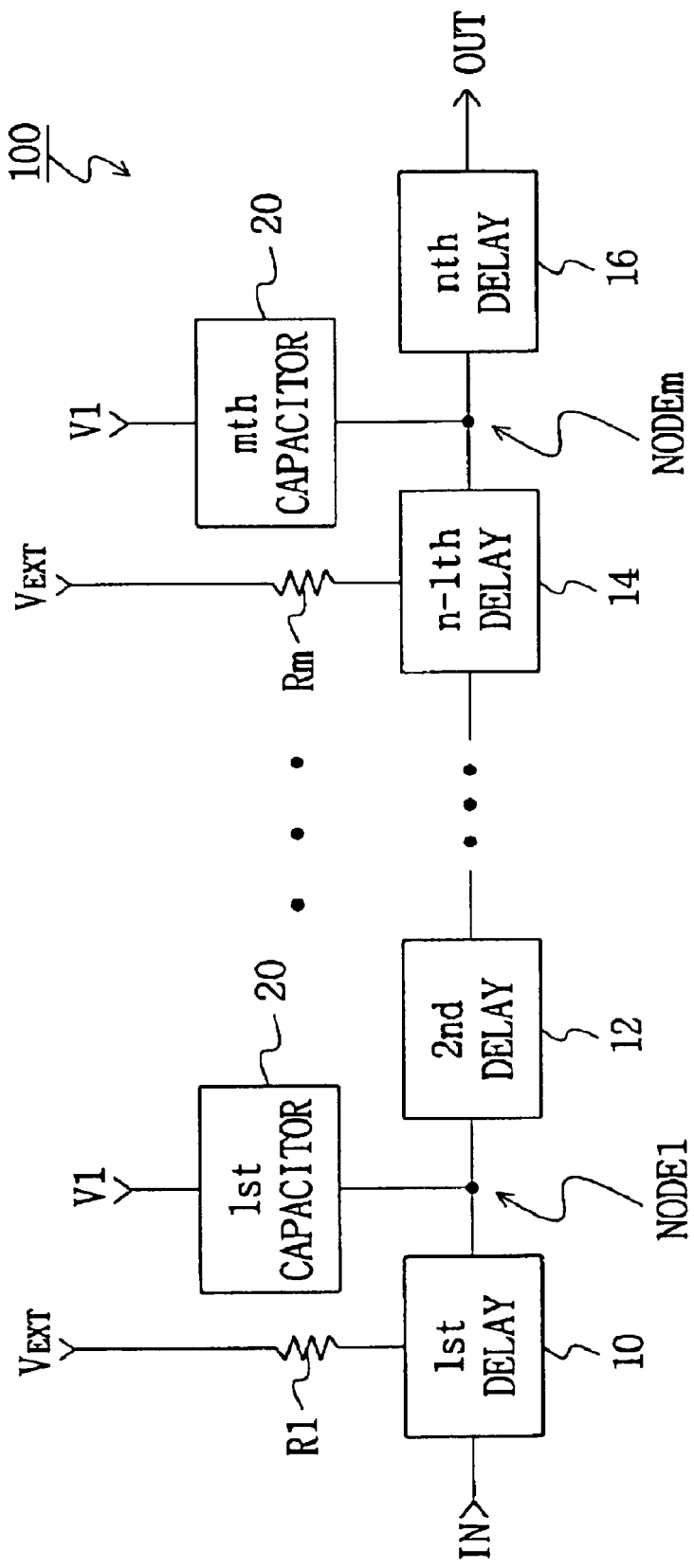
FIG. 2 is a block diagram of a delay circuit, e.g., that can be used with a semiconductor device, according to an embodiment of the present invention.

FIG. 2 is a block diagram of a delay circuit 100, e.g., for use with a semiconductor device such as a memory device, according to an embodiment of the present invention, and FIG. 3 is a circuit diagram illustrating an example implementation 300 of delay circuit 100 (of FIG. 1), according to another embodiment of the present invention.

In FIG. 2, delay circuit 100 includes: first through $n^{th}$ delay units 10, 12, . . . , 14, 16, respectively, that are cascade-connected and represent n stages, where n is a positive number and n≧2; first through $m^{th}$ resistance units R1, . . . , Rm, respectively, where m is a positive integer and 2≦m≦n; and first through $m^{th}$ capacitance units 20, . . . , 22, respectively.

Resistance units R, . . . , Rm, respectively, are connected between odd-numbered first through n−$1^{th}$ delay units 10, . . . , 14 and a node having an operating voltage of delay circuit 100, e.g., an externally-provided source voltage (again, $V_{EXT}$). A contrast to the delay chain of the Background Art is that delay circuit 100 can operate well without resistance units being connected between even-numbered delay units 12, . . . , 16 and a node having ground voltage. First through $m^{th}$ capacitance units 20, . . . , 22 are connected between a node having a control signal of voltage V1, and nodes NODE1, . . . , NODEm, respectively. Node NODEi represents a connection point between the output of an $i^{th}$ delay unit and the input of an i+$1^{th}$ delay unit, e.g., node NODE1 is represents the connection point between the output of first delay unit 10 and the input of second delay unit 12. Another contrast to the delay chain of the Background Art is that delay circuit 100 can operate well without capacitance units being connected between nodes even-numbered nodes, e.g., NODE2, and ground voltage.

Relative to delay units 10, . . . , 16, delay circuit 100 also includes another type of delay unit, namely an RC-type delay unit having an RC time constant. Resistance unit R1 and first capacitance unit 20 together can comprise a first RC-type delay unit, . . . , and resistance unit Rm and $m^{th}$ capacitance unit 22 together can comprise an $m^{th}$ RC-type delay unit.

While $V_{EXT}$ has a magnitude that can vary substantially, V1 has magnitude (relative to $V_{EXT}$) that is substantially uniform. Because the RC-type delay units are not connected to $V_{EXT}$, the delay times of the RC-delay units do not increase with increases in $V_{EXT}$, which is a contrast to the Background Art delay chain and, as such, is an advantage of delay circuit 100.

An input signal IN applied to an input terminal is delayed by a delay operation of delay units 10, 12, . . . , 14, 16, resistance units R, . . . , Rm and capacitance units 20, . . . , 22, and the delayed version appears on an output terminal as output signal OUT. If n is an even number, then a phase of output signal OUT is equal to a phase of input signal IN. And if n is an odd number, then a phase of output signal OUT becomes opposite to a phase of input signal IN. Delay times between inputs and outputs of first through nth delay units 10, 12, . . . , 14, 16, respectively, depend upon a level of $V_{EXT}$.

In delay circuit 300 of FIG. 3, as an example it is assumed that m=n/2, and n=4. First through $n^{th}$ delay units 10, 12, . . . , 14, 16 of FIG. 2 correspond to inverters, e.g., CMOS inverters, 310, 312, 314 and 316. First through $m^{th}$ resistance units R1, . . . , Rm correspond to resistors R1, R2. First through $m^{th}$ capacitance units 20, . . . , 22 of FIG. 2 correspond to transistors, e.g., PMOS transistors (or, in other words PMOS capacitors), 320, 322. It should be understood that other values of n and m are contemplated, hence m=n/2, and n=4 are not limitations.

In FIG. 3, $V_{EXT}$ is applied as an operating voltage to resistance units R1, Rm and to even-numbered inverters 312, 316. But V1 is applied to capacitance units 20, 22. If a level of $V_{EXT}$ rises, a delay time of inverters 310, 314 is reduced by a current increase through resistance units R1, Rm. Additionally, since amounts of charge accumulated by capacitance units 320, 322 do not increase proportionally to an increase in $V_{EXT}$ (because capacitor units 320, 322 are sourced by V1 instead of $V_{EXT}$), then the delay times of the RC-type delay units corresponding to capacitor units 320, 322 do not increase as $V_{EXT}$ increases. Rather, delay times of capacitor units 320, 322 are substantially unaffected by changes in $V_{EXT}$. As reductions in the delay times of inverters 310, 314 are not offset by increases in the delay times of capacitor units 320, 322 (as would be the case according to the Background Art), then the delay time of delay circuit 300 as a whole can be more significantly reduced (relative to the Background Art) as $V_{EXT}$ increases.

As a further example, consider delay circuit 300 as being used in a high-speed semiconductor device for the circumstances in which resistors R1, R2 are set to about 3.5 kilo-ohm (kΩ), PMOS capacitors 320, 322 are set to about 100 square micrometers ($\mu m^2$), and 10 cascade-connected stages are provided. A resulting delay time for delay circuit 300 as a whole, using $V_{EXT}$ of about 1.6 volts (V), is about 5 nanoseconds (ns).

Figure 7:
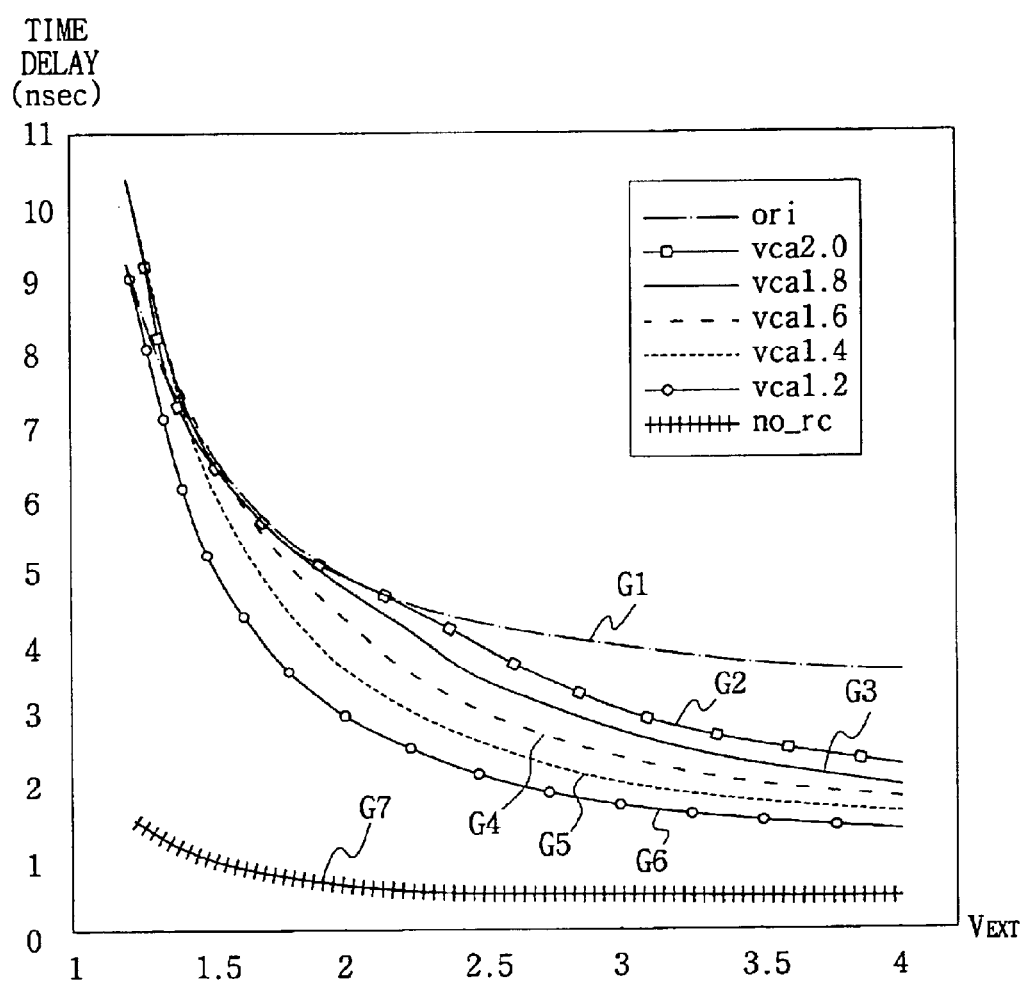
FIGS. 7 through 9 are graphs of curves, illustrating changes in delay times of example implementations of various embodiments of the present invention, as contrasted to delay times for the Background Art, respectively.

FIG. 7 depicts a graph of curves G2–G6 representing delay times for an example implementation of delay circuit 300. In FIG. 7, the transverse axis indicates $V_{EXT}$ in units of volts V, and the longitudinal axis represents delay time in units of nanosecond nsec. More particularly, curves G2–G6 represent different values of V1, namely reduced by a decrement of 0.2 V from 2.0 V to 1.2 V, respectively. Curve G1 represents a delay time when $V_{EXT}$ is applied to capacitance units 320, 322 in analogy to the Background Art delay chain. Curve G7 provides an illustration of an example of delay time where the RC-type delay units are removed.

Inspection of FIG. 7 reveals that the delay times of curves G2–G6 are substantially reduced as contrasted with curve G1 (which, again, is suggestive of delay times for the Background Art delay chain).

Figure 4:
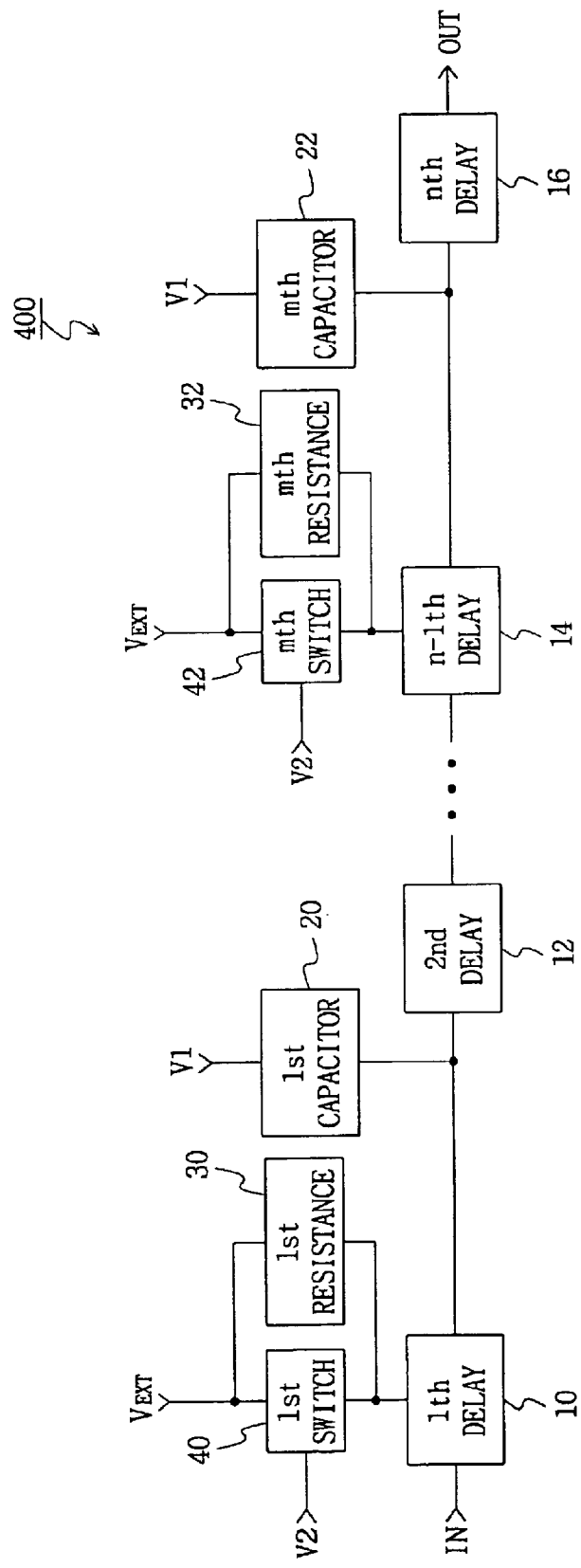
FIG. 4 is a block diagram of a delay circuit, e.g., that can be used with a semiconductor device, according to another embodiment of the present invention.

FIG. 4 is block diagram of a delay circuit 400, e.g., for use with a semiconductor device such as a memory device, according to another embodiment of the present invention. FIG. 5 is a circuit diagram illustrating an example implementation 500 of delay circuit 400 (of FIG. 4), according to another embodiment of the present invention.

Delay circuit 400 is similar to delay circuit 300, but differs, e.g., in that resistance units R1, . . . , Rm have been replaced with first to $m^{th}$ resistance units 30, . . . , 32, respectively, and first to $m^{th}$ switching units 40, . . . , 42, respectively. For brevity, discussion of delay circuit 400 will focus more on differences relative to delay circuit 300 rather than similarities. In delay circuit 400, switch units 40, . . . , 42 and resistance units 30, . . . , 32 are connected in parallel between a node having $V_{EXT}$ and odd-numbered first through n–$1^{th}$ delay units 10, . . . , 14, respectively. According to whether first through $m^{th}$ switch units 40, . . . , 42 are controlled to be in an open state or a closed state by a second control signal of voltage V2, the effective impedance between $V_{EXT}$ and odd-numbered first through n–$1^{th}$ delay units 10, . . . , 14 can be changed.

Input terminal IN is delayed by operation of delay units 10, 12, . . . , 14, 16, the parallel combined resistances of resistance units 30, . . . , 32 and switch units 40, . . . , 42, and capacitance units 20, . . . , 22. The delayed version of input signal IN is output signal OUT. The parallel-combined resistance of first switch unit 40 and first resistance 30 together with first capacitance unit 20 comprise a first RC-type delay unit, . . . , parallel-combined resistance of $m^{th}$ switch unit 42 and $m^{th}$ resistance 32 together with $m^{th}$ capacitance unit 22 comprise an $m^{th}$ RC-type delay unit have an RC time constant.

Delay circuit 500 is similar to delay circuit 300, but differs, e.g., in that transistors P1, P2 are connected in parallel across resistors R1, R2, respectively. For brevity, discussion of delay circuit 500 will focus more on differences relative to delay circuit 300 rather than similarities. Switch units 40, . . . , 42 of FIG. 4 correspond to transistors, e.g., PMOS transistors, P1 and P2 whose gates are connected to a node having V2, whose sources are connected to $V_{EXT}$, whose drains are connected to inverters 310, 314, and which function as controlled switches, respectively.

A combined resistance value ($R_{P1R1}$) represented by the parallel connection of switch unit P1 and first resistance R1 obtained when switch unit P1 is closed is less than resistance R1, hence a current through $R_{P1R1}$ to inverter 310 is greater than a current passing through R1 to inverter 310 when switch unit P1 is open. Consequently, a delay time exhibited by inverter 10 is significantly reduced when transistor P1 is on (closed switch condition) relative to when transistor P1 is off (open switch condition). In other words, the delay time is shortened when transistor P1 is on. The same is effect is achieved through the operation of transistor P2. As a result, the delay time of delay circuit 500 as a whole with transistors P1 and P2 on is significantly reduced/shorter relative to when transistors P1 and P2 are off (where P1 and P2 being off corresponds to delay circuit 300).

Figure 9:
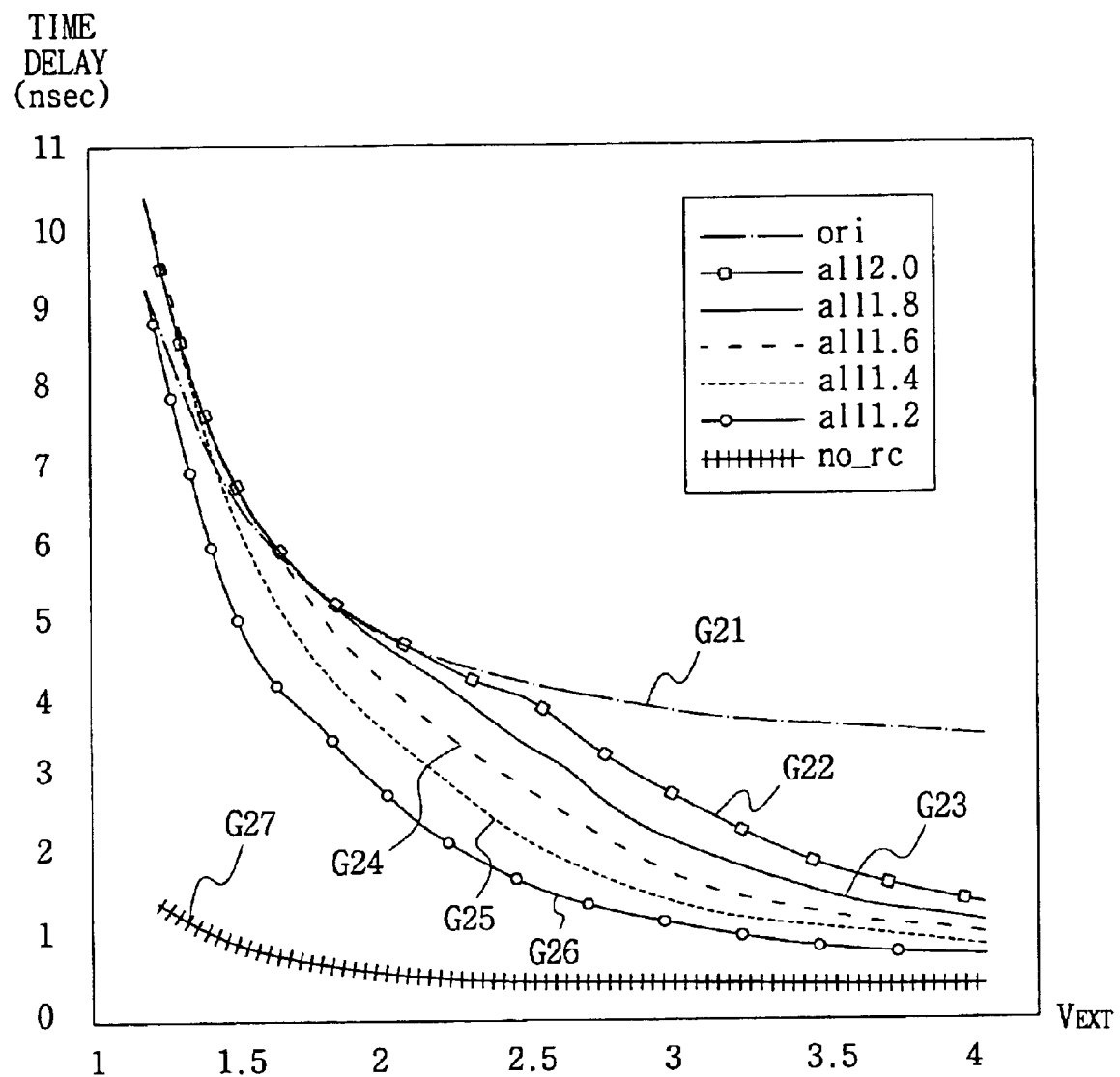

FIG. 9 depicts a graph of curves G22–G26 representing delay times for an example implementation of delay circuit 500. The plotting of curves in FIG. 9 is similar to FIG. 7. Curves G22–G26 represent different values of both V1 and V2, namely each reduced by a decrement of 0.2 V from 2.0V to 1.2 V, respectively. Curve G21, like curve G1 of FIG. 7, is suggestive of delay times for the Background Art delay chain. Curve G27 corresponds to curve G7 of FIG. 7.

Inspection of FIG. 9 reveals that the delay times of curves G22–G26 are substantially reduced as contrasted with curve G1 (which, again, is suggestive of delay times for the Background Art delay chain).

Figure 8:
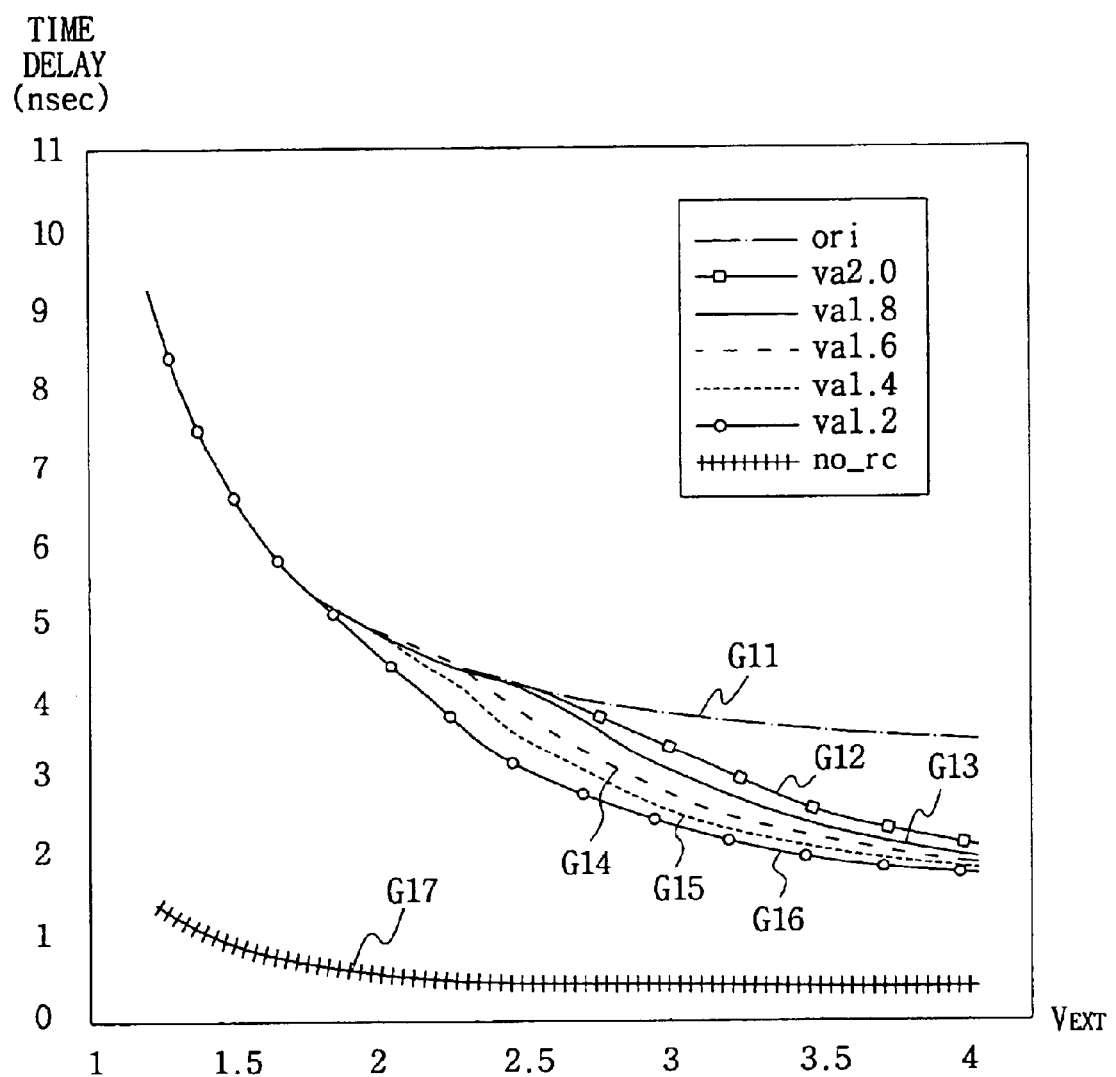

FIG. 8 depicts a graph of curves G12–G16 representing delay times for an example implementation of delay unit 500 for the circumstances in which $V_{EXT}$ is applied to capacitance units 320, 322 instead of V1, though V2 remains applied to the gates of transistors P1, P2. Curves G21—G21 represent different values of V2, namely reduced by a decrement of 0.2 V from 2.0V to 1.2 V, respectively. Curve G21, like curve G1 of FIG. 7, is suggestive of delay times for the Background Art delay chain. Curve G27 corresponds to curve G7 of FIG. 7.

As described above, according to at least one example embodiment of the present invention, when $V_{EXT}$ increases, amounts of charge stored at capacitance units 20, . . . , 22 do not correspondingly increase, and thus equivalent impedances and delay times of delay circuits 100 and 400 are smaller relative to the Background Art. When such delay circuits are used with semiconductor devices, e.g., memory devices, there can be less overdriving of a source voltage, which can lessen chances for access errors in data-access operations and yield reduced consumption of electricity.

FIGS. 6A and 6B are circuit diagrams illustrating example implementations of a control voltage generator that can generate V1 and/or V2, according to other embodiments of the present invention. In FIG. 6A, a control voltage generator 60a includes a resistance R1 connected at a node NO1 to a drain of a diode, e.g., an MOS diode, Q1. Control voltage generator 60a is arranged as threshold voltage type of reference voltage generator. In FIG. 6B, a control voltage generator 60b includes transistors, e.g., PMOS and NMOS transistors, PM1,PM2,NM1,NM2 and a resistance R1 connected at a node NO2 to transistor NM2. Control voltage generator 60b is arranged as a thermal voltage type of reference voltage generator. A reference voltage Vref can be obtained at nodes NO1 or NO2. Vref can be used as V1 and/or V2. Alternatively, an internal source voltage generator of the semiconductor device (with which delay units 100 and 400 can be used) can serve as the control voltage generator for V1 and/or V2.

It will be apparent to those skilled in the art that modifications and variations can be made in the present invention without deviating from the spirit or scope of the present invention. Thus, it is intended that the present invention cover any such modifications and variations. Some examples of such modifications follow.

Although, in the examples of embodiments discussed above, RC-type delay units are connected only to odd-numbered stages, alternatively RC-type delay units can be connected only to even-numbered stages or to all stages. Although, in the examples of embodiments discussed above, voltages V1 and V2 are the same, alternatively V1 and V2 can be different.

What is claimed is:

1. A delay circuit, for a semiconductor device, having a plurality of cascade-connected stages that successively delay an input signal, the delay circuit comprising:
    a plurality of cascaded-connected delay devices representing instances of a first type of delay unit corresponding to the plurality of stages, respectively;
    a plurality of resistance units coupled between a node having a source voltage of varying magnitude Vvar and odd-numbered ones of the plurality of delay devices, respectively; and
    a plurality of capacitance units coupled between a node having another voltage Vuni of substantially uniform magnitude relative to Vvar and nodes representing the outputs of the odd-numbered delay devices;

corresponding ones of the plurality of capacitor units and the plurality of resistance units representing instances, respectively, of a second type of delay unit.

2. The delay circuit as claimed in 1, wherein each of the plurality of capacitance units is an MOS-type capacitor.

3. The delay circuit as claimed in 2, wherein each of the plurality of delay devices is an MOS-type inverter.

4. The delay circuit as claimed in 3, wherein Vvar is externally-supplied.

5. The delay circuit as claimed in 1, wherein Vuni>Vvar.

6. The delay circuit as claimed in 1, wherein:

couplings represented by the plurality of resistance units are indirect types of couplings, respectively: and even-numbered ones of the plurality of delay devices have direct type couplings, respectively, relative to the indirect couplings.

7. A delay circuit, for a semiconductor device, having a plurality of cascade-connected stages that successively delay an input signal, the delay circuit comprising:

a plurality of cascaded-connected delay devices representing instances of a first type of delay unit corresponding to the plurality of stages, respectively;

a plurality of resistance units coupled between a node having a source voltage of varying magnitude Vvar and odd-numbered ones of the plurality of delay devices, respectively; and a plurality of capacitance units coupled between a node having a first control voltage V1 of substantially uniform magnitude relative to Vvar and nodes representing the outputs of the odd-numbered delay devices; and a plurality of switch units controlled by a second control voltage V2 of substantially uniform magnitude relative to Vvar and coupled in parallel with the plurality of resistance units between the node having Vvar and the odd-numbered delay devices, respectively;

corresponding ones of the plurality of switch units, the plurality of capacitor units and the plurality of resistance units representing instances, respectively, of a second type of delay unit.

8. The delay circuit as claimed in 7, wherein each of the plurality of capacitance units is an MOS-type capacitor.

9. The delay circuit as claimed in 7, wherein each of the plurality of delay devices is an MOS-type inverter.

10. The delay circuit as claimed in 7, wherein Vvar is externally-supplied.

11. The delay circuit as claimed in 7, wherein V1>Vvar.

12. The delay circuit as claimed in 7, wherein:

couplings represented by corresponding ones of the plurality of switching units and the plurality of resistance units are indirect types of couplings, respectively; and even-numbered ones of the plurality of delay devices have direct type couplings to Vvar, respectively, relative to the indirect couplings.

13. The delay circuit as claimed in claim 7, wherein V2=V1.

14. The delay circuit as claimed in 7, wherein each of the plurality of switch units is an MOS-type transistor.

15. The delay circuit as claimed in claim 7, wherein the plurality of stages has 4 stages.

16. The delay circuit as claimed in claim 1, wherein the plurality of stages has 4 stages.

17. The delay circuit as claimed in claim 1, further comprising switched resistance devices coupled in parallel with the plurality of resistance units between the node having Vvar and the odd-numbered delay devices, respectively, operation of which selectively changes impedances between the node having a source voltage of varying magnitude Vvar and the odd-numbered delay devices, respectively.

18. A delay circuit, for a semiconductor device, having a plurality of cascade-connected stages that successively delay an input signal, the delay circuit comprising:

a plurality of cascaded-connected delay means, corresponding to the plurality of stages, respectively, for respectively delaying signals passed therethrough;

a plurality of resistance means for providing impedances to currents flowing between a node having a source voltage of varying magnitude Vvar and odd-numbered ones of the plurality of delay means, respectively; and a plurality of capacitance means for providing capacitances between a node having another voltage Vuni of substantially uniform magnitude relative to Vvar and nodes representing outputs of the odd-numbered delay means, respectively;

corresponding ones of the plurality of capacitance means and the plurality of resistance means being operable for providing delays of an RC-type, respectively.

19. The delay circuit as claimed in claim 18, further comprising:

a plurality of switched second resistance means coupled in parallel with the plurality of first resistance means between the node having Vvar and the odd-numbered delay devices, respectively, and for selectively changing impedances between the node having Vvar and the delay means, respectively.

* * * * *